(12) United States Patent
Hagh et al.

(10) Patent No.: US 7,260,157 B2
(45) Date of Patent: Aug. 21, 2007

(54) PHASE SHIFTED TRANSMITTER ARCHITECTURE FOR COMMUNICATION SYSTEMS

(76) Inventors: Sotoudeh Hamedi Hagh, 666 Spadina Rd., Apt. 2205, Toronto, Ontario (CA) M5S 2H8; C. Andre T. Salama, 66 Castlewood Rd., Toronto, Ontario (CA) M5N 2L2

( * ) Notice: Subject to any disclaimer, the term of this patent is extended or adjusted under 35 U.S.C. 154(b) by 720 days.

(21) Appl. No.: 10/300,637

(22) Filed: Nov. 21, 2002

(65) Prior Publication Data

US 2004/0101065 A1    May 27, 2004

(51) Int. Cl.
*H04K 1/02*    (2006.01)
*H04L 25/03*    (2006.01)
*H04L 25/49*    (2006.01)

(52) U.S. Cl. .................. 375/297; 375/296; 375/295

(58) Field of Classification Search ............... 375/297, 375/296, 345, 295; 455/102, 127.1, 127.2, 455/127.3; 330/107, 124 R, 129
See application file for complete search history.

(56) References Cited

U.S. PATENT DOCUMENTS

| | | | |
|---|---|---|---|
| 5,105,168 A | 4/1992 | DaSilva | ................. 331/2 |
| 6,054,894 A | 4/2000 | Wright et al. | ............... 330/149 |
| 6,366,177 B1 | 4/2002 | McCune et al. | ............ 332/103 |
| 6,825,719 B1 * | 11/2004 | Barak et al. | ................. 330/129 |
| 6,889,034 B1 * | 5/2005 | Dent | ......................... 455/102 |

OTHER PUBLICATIONS

"Linear Amplification with nonlinear components", D.C. Cox, IEEE Transactions on Communications, Dec. 1974, pp. 1942-1945.

"A phase-opposition system of amplitude modulation", L.F. Gaudernack, Proceedings of the Institute of Radio Engineers, vol. 26, No. 8, Aug. 1938, pp. 983-1008.

"High power outphasing modulation", H. Chireix, Proceedings of the Institute of Radio Engineers, Vo. 23, No. 11, Nov. 1935, pp. 1370-1392.

"A 200-MHz if BiCMOS signal component separator for linear LINC transmitters", Bo-Shi, IEEE Journal of Solid-State Circuits, vol. 35, No. 7, Jul. 2000, pp. 987-993.

"The combined analogue locked loop universal modulator (CALLUM)", Centre for Communications Research, University of Bristol, pp. 759-763, IEEE, 1992.

"A high-efficiency RF transmitter using VCO-derived synthesis: CALLUM", David J. Jennings et al. IEEE Transactions on Microwave Theory and Techniques, vol. 47, No. 6, Jun. 1999, pp. 715-721.

"Cordic trigonometric function generator for DSP", Vincent Considine, IEEE, 1989, pp. 2381-2384.

"Class-F power amplifiers with maximally flat waveforms", Frederick H. Raab, IEEE Transactions on Microwave Theory and Techniques, vol. 45, No. 11, Nov. 1997, pp. 2007-2012.

(Continued)

*Primary Examiner*—Phuong Phu
(74) *Attorney, Agent, or Firm*—Marks & Clerk; S. Mark Budd (57) ABSTRACT

The phase shifted (PS) transmitter provides substantially linear amplification from two non-linear amplifiers by decomposing the original signal into two constant envelope signals with varying phases. The generation of the two constant envelope signals does not require the use of a signal component separator (SCS) or a reference signal generator. The phase shifted transmitter generates directly the required constant envelope, varying phase signals. This eliminates stringent requirements on the circuitry and allows the use of non-linear highly efficient power amplifiers in the transmitter. When the two above mentioned signals are combined, they constructively and destructively interfere to re-form an amplified form of the original signal, which is to be transmitted via an antenna.

2 Claims, 6 Drawing Sheets

OTHER PUBLICATIONS

"Ultra compact, low loss, varactor tuned phase shifter MMIC at C-band", Frank Ellinger, IEEE Microwave and Wireless Components Letters, vol. 11, No. 3, Mar. 2001, pp. 104-105.

"A CMOS RF power amplifier with parallel amplification for efficient power control", Alireza Shirvani, IEEE Journal of Solid-State Circuits, vol. 37, No. 6, Jun. 2002, pp. 684-693.

* cited by examiner

PHASE SHIFTED TRANSMITTER ARCHITECTURE FOR COMMUNICATION SYSTEMS

FIELD OF THE INVENTION

The present invention relates generally to communication systems, and more particularly to a phase shifted transmitter improving on the linearity and power efficiency of the transmitter, by better utilizing the realization that any envelope and phase modulated signal can be represented by the summation of two components with fixed envelopes but varying phases.

BACKGROUND OF THE INVENTION

In communication systems, a signal to be transmitted is typically concentrated around a particular carrier frequency occupying a defined channel. Information is sent in the form of modulation of frequency, envelope or phase or some combination of these which causes the information to be represented by energy spread over a band of frequencies around the carrier frequency. In many schemes the carrier itself is not sent since it is not essential to the communication of the information.

Modulation schemes which vary the envelope and phase of the carrier such as the Quaternary Phase Shift Keying (QPSK) and the Quadrature Amplitude Modulation (QAM) have high spectral efficiency and are suitable for multi-user systems transmitting a large amount of information in a limited frequency bandwidth. When the modulation scheme generates a varying envelope, the transmitter must be extremely linear to preserve the narrowbandness of the output signal. The most crucial block which determines the linearity of the transmitter is the power amplifier (PA).

Many communication systems, such as mobile multi-user systems impose stringent requirements on the linearity of the PA. For this reason, linear PA architectures such as class A, class AB, class B, and class C are commonly used. However, the efficiency of such PAs at high output power levels is limited and they become non-linear causing Adjacent Channel Interference (ACI) and limiting the spectral efficiency of the communication system. Linearization techniques such as Cartesian feedback, adaptive predistortion and feedforward have been used to improve the linearity of the PAs in such applications. However, these methods add considerably to the complexity and the power dissipation of the transmitter and reduce the overall efficiency of the PAs making them unsuitable for use in hand held and portable devices, where battery size and life are of jugular importance.

A frequent goal was to design a linear transmitter architecture for spectrally efficient communication systems to overcome the low transmitter efficiency caused by using linear PAs. To achieve the objective, a system, known as the outphasing modulation, was developed in the 1930's for Amplitude Modulation (AM) broadcast transmitters and methods based on this concept were later developed including the LINC (LInear amplification using Non-linear Components) and CALLUM (Combined Analog Locked-Loop Universal Modulator) systems. The essence of these techniques lies in the realization that any envelope and phase modulated signal can be represented by the summation of two components with fixed envelopes but varying phases. The advantage of this transformation is that each phase modulated component can be amplified using highly non-linear yet power efficient techniques without generating Adjacent Channel Interference (ACI). There exist many credentials that discuss the above-mentioned considerations. The U.S. Pat. No. 6,054,894, to Wright et al. as well as D. C. Cox's "Linear Amplification With Nonlinear Components," *IEEE Transactions on Communication*, vol. COM-22, pp.1942-1945, 1974, illustrate the LINC transmitter, where the U.S. Pat. No. 6,366,177, to McCune et al. and A. Bateman's "The Combined Analog Locked Loop Universal Modulator (CALLUM)," *Proceeding of the 42nd IEEE Vehicular Technology Conference*, pp. 759-764, 1992, illustrate the CALLUM transmitter.

The concept of the LINC transmitter is to represent an envelope varying signal by two constant envelope signals with varying phases and amplify them separately using non-linear amplifiers. These two signals are then added together to produce a linear amplified replica of the input signal.

Figure 1:
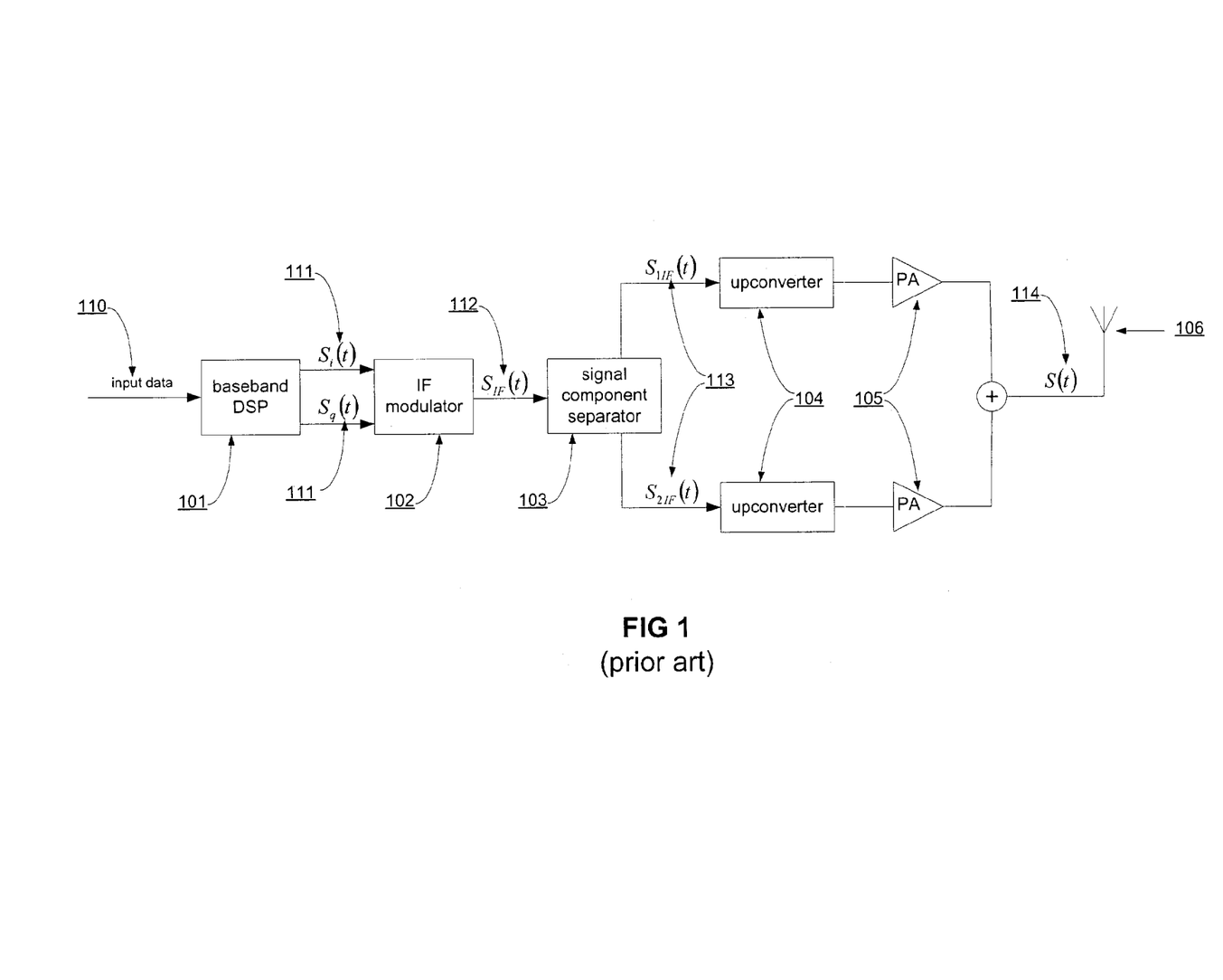
FIG. 1 is a block diagram showing the prior art system configuration.

FIG. 1 illustrates the notion of the LINC transmitter. The baseband Digital Signal Processor (DSP) 101 is used to process the input data 110 and generate two quadrature signals 111 $s_i(t)$ and $s_q(t)$, where $s_i(t)$ represents the in-phase component and $s_q(t)$ represents the out-of-phase or quadrature component. The IF modulator 102 generates the Intermediate Frequency (IF) signal 112. The Signal Component Separator (SCS) 103 is used to convert the IF signal 112 into two constant envelope signals 113 $s_{1IF}(t)$ and $s_{2IF}(t)$, which are phase modulated, by adding and subtracting a mediator signal to and from the IF signal 112. The mediator signal can be obtained from the input IF signal 112.

The implementation of the SCS 103 has been one of the major problems in the realization of the LINC concept because of the high frequency operation. As a result, the SCS 103 usually operates at Intermediate Frequencies (IFs) rather than radio frequencies (RFs) and the two constant envelope signals 113 must be translated to RF using upconverters 104, as illustrated in FIG. 1, prior to transmission from the antenna 106. The two upconverters 104 add to the power dissipation of the transmitter and generate Intermodulation Distortion (IMD) affecting the overall linearity of the transmitter. Furthermore, the SCS 103 may not accurately operate over the full bandwidth of the IF signal 112 and may introduce gain and phase misalignments between the two constant envelope signals 113. Such misalignments appear as non-linearities at the output of the LINC transmitter 114.

CALLUM is an alternative technique which can provide the constant envelope signals. The CALLUM system uses a feedback architecture and employs two Voltage Controlled Oscillators (VCOs) controlled by reference signals to generate the phase modulated constant envelope signals. The reference signals are obtained by comparison of the quadrature components of the input and the downconverted output at baseband.

Another alternative used to achieve the same objectives as LINC and CALLUM is the Vector Locked Loop (VLL) system. The VLL also utilizes VCOs as does the CALLUM, but requires signal processing using polar (magnitude and phase) rather than Cartesian (in-phase and out-of-phase) signals.

To generate the two components of the output at baseband frequency using either CALLUM or VLL, requires a downconverting mixer operating at RF which adds to the complexity and the power dissipation of the transmitter. In addition, the non-linearities caused by the downconverting mixer reduce the accuracy of the reference signal generation. The accurate operation of the CALLUM and VLL systems is also limited to a narrowband spectrum because of the feedback configuration which has a limited loop capture range and instability at high loop gains.

Although the prior art overcomes some of the drawbacks mentioned above, they still require upconverters, downconverters, a feedback system or an SCS, or some combination of these which complicate the design and increase the power dissipation.

SUMMARY OF THE INVENTION

To overcome the limitations of the prior art described above, and to overcome other limitations that will become apparent upon reading and understanding the present specification, the present invention discloses a system and method that better utilize the realization that any envelope and phase modulated signal can be represented by the summation of two components with fixed envelopes but varying phases.

The phase shifted (PS) transmitter provides substantially linear amplification from two non-linear amplifiers by decomposing the original signal into two constant envelope signals with varying phases, which, when combined, constructively and destructively interfere to re-form the original signal. The output of the phase shifted (PS) transmitter, which is to be transmitted via an antenna, is an amplified form of the original signal.

Contrary to the LINC, CALLUM or VLL systems, the generation of the two constant envelope signals does not require the use of a SCS or a reference signal generator. The phase shifted transmitter generates directly the required constant envelope, varying phase signals by utilizing a baseband operation.

The PS transmitter offers improved matching between the two constant envelope branches compared to the LINC method whose linearity is sensitive to the mediator signal, which is obtained from an IF signal instead of a baseband signal. The same is true in CALLUM system in which linearity may be affected by the performance of the down-converting mixers. Also, the PS transmitter offers improved bandwidth compared to the LINC and CALLUM systems since no component separation of the envelope varying IF signal and no frequency/phase lock methods are used.

DETAILED DESCRIPTION OF THE PREFERED EMBODIMENT

The following description is presented to enable any person skilled in the art to make use of the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The phase shifted transmitter (hereinafter, referred to as PS transmitter), proposed in this disclosure, offers an alternative approach to generate the two constant envelope signals with varying phases for linear and efficient amplification. After amplification, the two signals are added to form the required modulated RF signal.

Contrary to the LINC, CALLUM or VLL systems, the generation of the two constant envelope signals does not require the use of a SCS or a reference signal generator. The phase shifted transmitter generates directly the required constant envelope, varying phase signals by utilizing a baseband operation. As a result, there are no upconverters in the PS transmitter resulting in improved linearity and a simplified design as compared to the LINC transmitter.

The PS transmitter offers improved matching between the two constant envelope branches compared to the LINC method whose linearity is sensitive to the mediator is signal, which is obtained from an IF signal instead of a baseband signal. The same is true in CALLUM system in which linearity may be affected by the performance of the down-converting mixers. Also, the PS transmitter offers improved bandwidth compared to the LINC and CALLUM systems since no component separation of the envelope varying IF signal and no frequency/phase lock methods are used.

Figure 2:
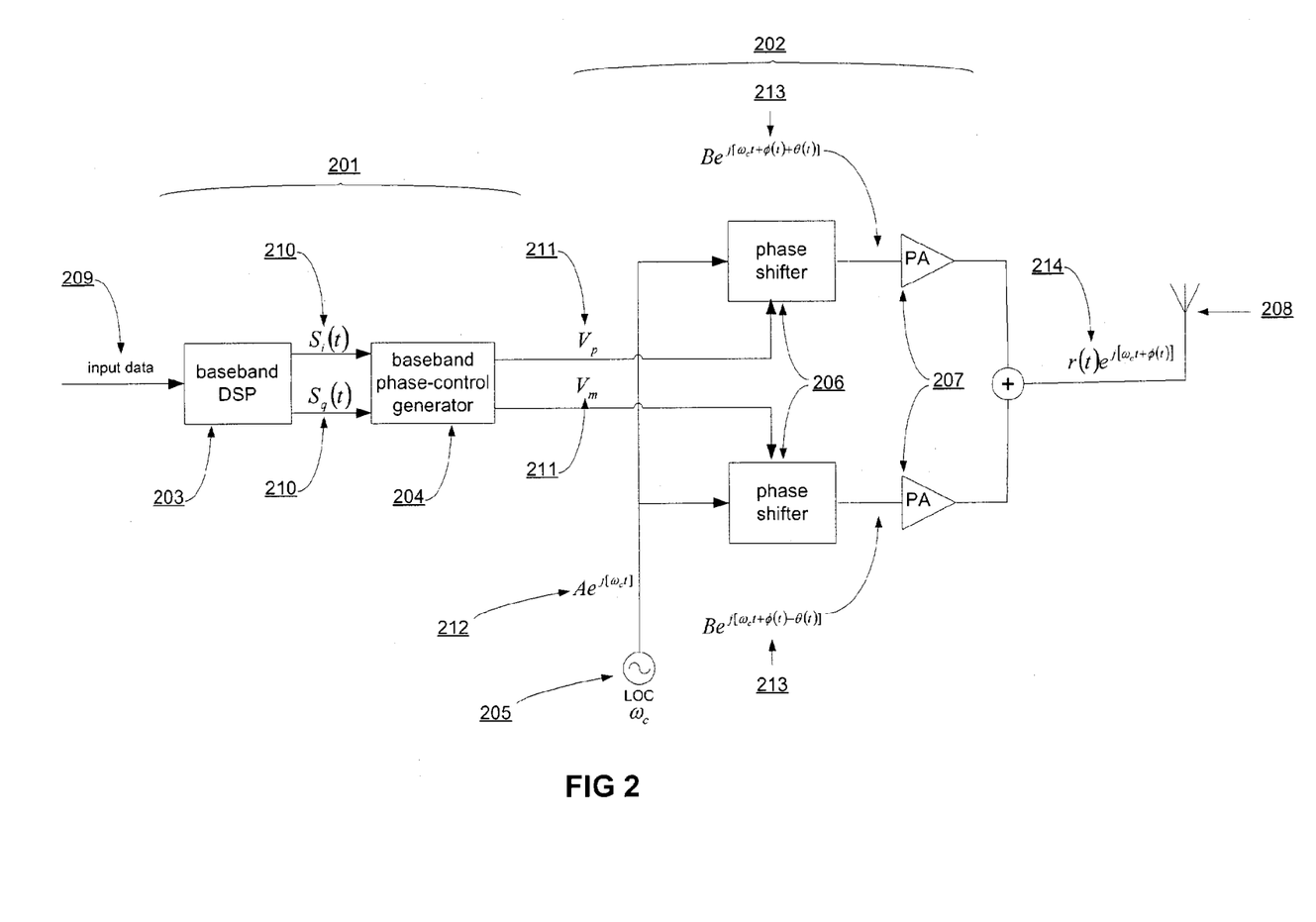
FIG. 2 is a block diagram showing the proposed phase shifted transmitter configuration.

FIG. 2 is used to illustrate the notion of the PS transmitter. The phase shifted transmitter consists of two sections, the baseband section 201 and the RF section 202. The baseband section 201 consists of the baseband Digital Signal Processor (DSP) 203 and the baseband phase control generator 204. Because the baseband signal frequency is orders of magnitude lower than the RF signal frequency, the baseband building blocks are easily realizable using either digital or analog processing approaches. The RF section 202 includes the local oscillator (LOC) 205, the phase shifters 206 and the PAs 207. The phase shifted transmitter uses no upconversion, downconversion or feedback and offers a simple efficient architecture as compared to the LINC, CALLUM or VLL systems. The individual components of the PS system will be discussed in more details in paragraphs to follow.

The PS transmitter varies the phases of the two carriers proportional to $\phi(t)+\theta(t)$ and $\phi(t)-\theta(t)$ respectively to generate the required constant envelope signals with varying phases. The general representation of the output RF signal of the transmitter may be defined by the following equation:

$$s(t)=[s_i(t)+js_q(t)]\times e^{j[\omega_c t]}$$

and the two constant envelope signals with varying phases may be defined by the following two equations:

$$s_1(t)=r_{max}e^{j[\omega_c t+\phi(t)+\theta(t)]}$$

$$s_2(t)=r_{max}e^{j[\omega_c t+\phi(t)-\theta(t)]}$$

where:

$r_{max}$=the maximum peak of the envelope;

$$\phi(t) = \tan^{-1}\left[\frac{s_q(t)}{s_i(t)}\right];$$

$$\theta(t) = \cos^{-1}\left[\frac{\sqrt{s_i^2(t)+s_q^2(t)}}{2r_{max}}\right].$$

The trigonometric functions used to obtain ø(t) and θ(t) can be easily generated using either digital or analog techniques.

The baseband DSP 203 converts the analog input to digital signal and processes the input data 209 based on the communication access and channel requirements. The output of the baseband DSP 203 usually consists of two signals 210 representing the in-phase (I) and the out-of-phase or quadrature (Q) signals noted as $s_i(t)$ and $s_q(t)$. The I-Q baseband signals 210 can be obtained in either digital or analog forms depending on the requirements of the system. The baseband DSP 203 is easily integrable in low power, low voltage CMOS technologies.

The baseband phase control generator 204 provides two output voltages 211 $V_p$ and $V_m$ which when applied to the phase shifter provide RF signals with phases which are proportional to ø(t)+θ(t) and ø(t)−θ(t) respectively.

The RF carriers 212 from the LOC 205 and the baseband signals 211 $V_p$ and $V_m$, are applied to the phase shifters 206. The outputs of the phase shifters 206 are two constant envelope signals 213 with time varying phases. The phase shifters 206 operate at the carrier frequency of interest but their output to input phase variations change as a function of the baseband signals 211.

Figure 3:
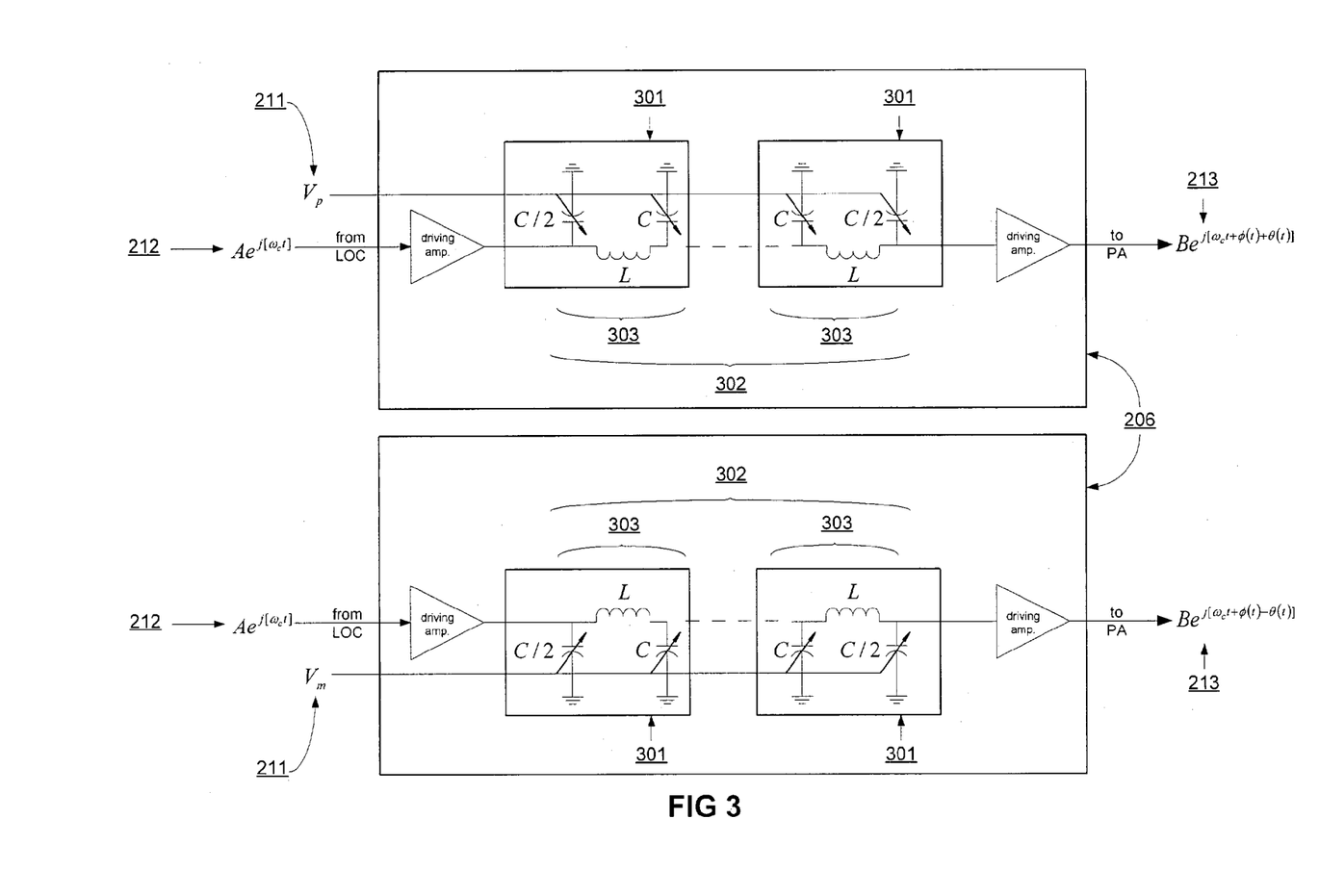
FIG. 3 shows the single ended structure of the phase shifter.

Referring to FIG. 3, a suitable integrated realization of the phase shifters 206 is the varactor tuned lumped equivalent of a transmission line. The lumped equivalent of the quarter-wavelength transmission lines 303 can be realized using cascades of Π segments 301 consisting of on-chip inductors and capacitors as LC ladders, where the lumped components are given by:

$$L = \frac{Z_O}{4nf_c} \quad C = \frac{1}{4nZ_Of_c}$$

where:
n=the number of Π segments 301;
$Z_O$=the characteristic impedance of the quarter-wavelength transmission line 303;
$f_c$=the carrier frequency.

Increasing the number of Π segments 301 increases the maximum phase shift provided by the phase shifter 206. Every Π segment 301 provides higher than 30° phase shift of the RF signal depending on the tuning range of the varactors used.

The phase shifter 206 in the PS transmitter is realized by a half-wavelength transmission line equivalent 302 obtained by cascading two quarter-wavelength transmission line equivalents 303 connected between two driving amplifiers 304 as shown in FIG. 3.

The output to input phase variation of the phase shifter 206 depends on the control voltage 211 applied to the phase shifter 206. For a linear transfer function, the rate of the change in the output to input phase variation is proportional to the control voltages 211 $V_p$ and $V_m$. However, the phase shifters 206 are generally non-linear. Therefore, to generate the correct constant envelope signals 213 with varying phases, it is necessary to compensate for the non-linearity of the phase shifter 206 transfer function. This compensation is implemented by the baseband phase control generator 204 using either digital or analog techniques. In case of compensation using digital techniques, the output digital codes provided by the baseband phase control generator 204 must be converted back to analog voltages compatible with the phase shifters 206.

The phase transfer function of the varactor tuned LC ladder phase shifter 206 shown in FIG. 3 can be approximated by a sine function which means that by applying a ramp control voltage to the phase shifter, the output to input phase of the phase shifter varies as:

$$ø(t)+θ(t)=α \sin(β+λV_p)$$

$$ø(t)-θ(t)=α \sin(β+λV_m)$$

where:
α, β & λ are constants depending on the number of cascaded ladders;
$V_p$ & $V_m$ are the effective control voltages 211 applied to the varactor capacitors.

The power amplifier 207 can be realized using one of the non-linear switching architectures such as class E or class F. A class E PA, can achieve maximum efficiency at low supply voltages because of its higher optimum load compared to a class F design. However, a class E PA is subject to higher voltage stress compared to a class F design, because of its higher peak output voltage. Therefore, a class E design may not be suitable for submicron technology implementation because of the breakdown voltage constraints.

Figure 4:
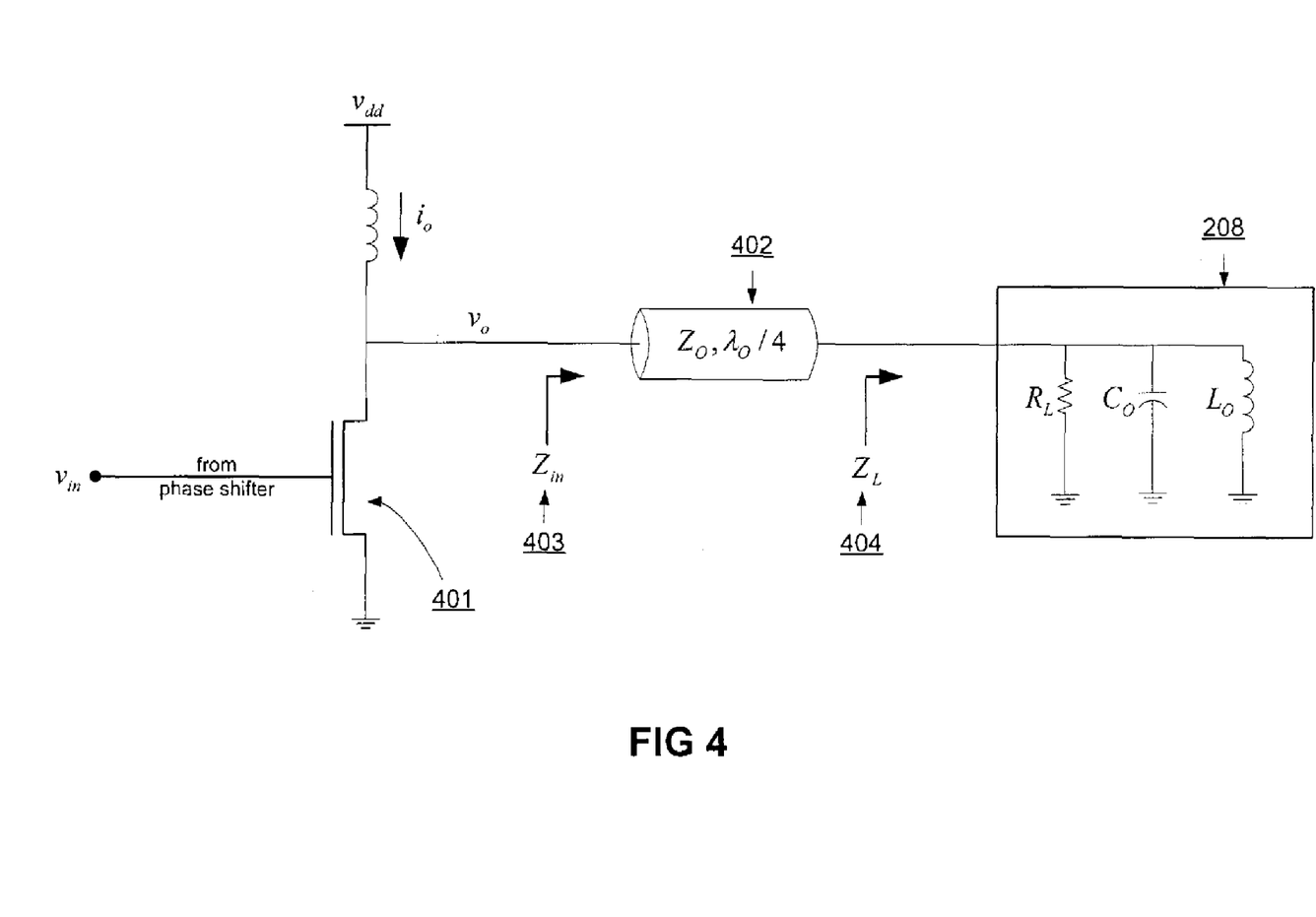
FIG. 4 illustrates a class F power amplifier.

As shown in FIG. 4, a class F design is therefore the preferred alternative to realize the PA 207 and is realizable using a switching power transistor 401 connected to a quarter-wavelength transmission line 402.

The quarter-wavelength transmission line 402 connecting the switching transistor 401 to the antenna 208 must perform three tasks. First, it forms the class F PA architecture. Second, it makes the summation of the two constant envelopes 213 with varying phase signals feasible at the antenna 208. Third, it matches the output resistance of the switching transistor 401 to the impedance of the antenna 208.

The input impedance 403 of the quarter-wavelength transmission line 402 at odd harmonics of the carrier frequency is given by:

$$Z_{in} = \frac{Z_O^2}{Z_L}$$

and at even harmonics of the carrier frequency by:

$$Z_{in}=Z_L$$

where:
$Z_O$=the characteristic impedance of the quarter-wavelength transmission line 402;
$Z_L$=impedance of the antenna 208.

Figure 5:
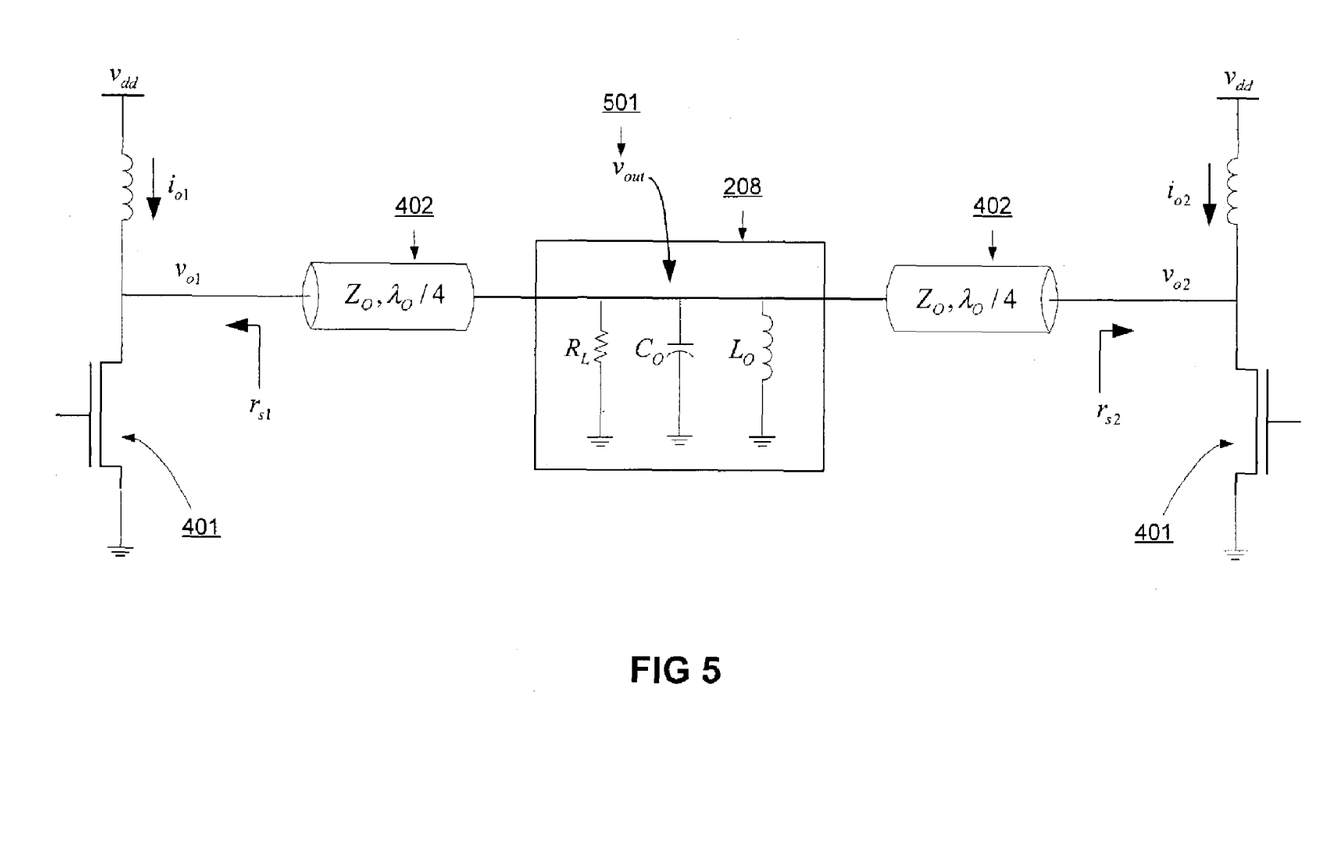
FIG. 5 illustrates the output summing at the antenna.

When the outputs of the two class F PAs 207 are connected to each other as shown in FIG. 5, their outputs are summed at the antenna 208. In this case, the output voltage 501 at the antenna 208 is given by:

$$V_{out} = \frac{Z_OZ_L}{r_{s2}Z_L + r_{s1}Z_L + Z_O^2} \times (V_{o1} + V_{o2})$$

where:
$r_{s1}$ & $r_{s2}$=output resistance of the switching power transistor 401;
$Z_O$=the characteristic impedance of the two quarter-wavelength transmission lines 402;
$Z_L$=impedance of the antenna 208.

The above equation is valid as long as the physical length of the two transmission lines 402 are equivalent to odd multiples of the quarter-wavelength (i.e. $\lambda_O/4, 3\lambda_O/4, \ldots$).

The quarter-wavelength transmission lines 402 in the class F PAs 207 also perform the impedance matching between the output resistances of the switching power transistors 401 $r_{s1}$ and $r_{s2}$, and the impedance of the antenna 208 $Z_L$ at the frequency of the RF signal.

The single quarter-wavelength transmission line performs the impedance matching in one step for a large impedance transformation ratio, from $r_s$ to $Z_L$, increasing the reflection coefficient between the two impedances and narrowing the bandwidth for which the impedance transformation is valid.

To achieve a wideband impedance matching, the impedance transformation must be performed in smaller ratios to reduce the reflection coefficients between the two transformed impedances. The gradual impedance matching between the output of the switching power transistor and the antenna can be achieved using a 2K+1 cascades of quarter-wavelength transmission lines where K is an integer larger or equal to one.

Figure 6A:
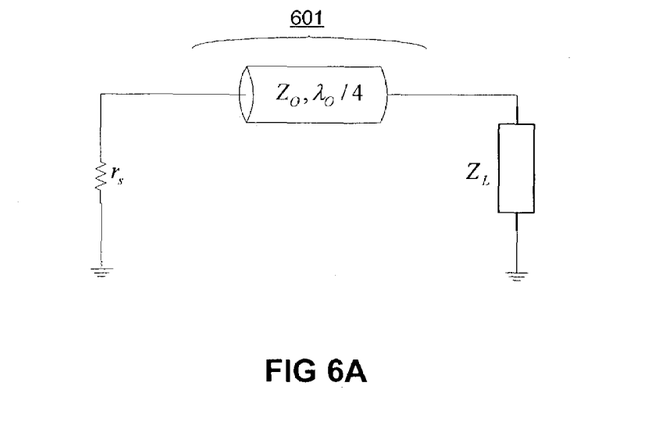
FIG. 6A and FIG. 6B illustrate the impedance matching with a single line and with cascades of three lines respectively.
Figure 6B:
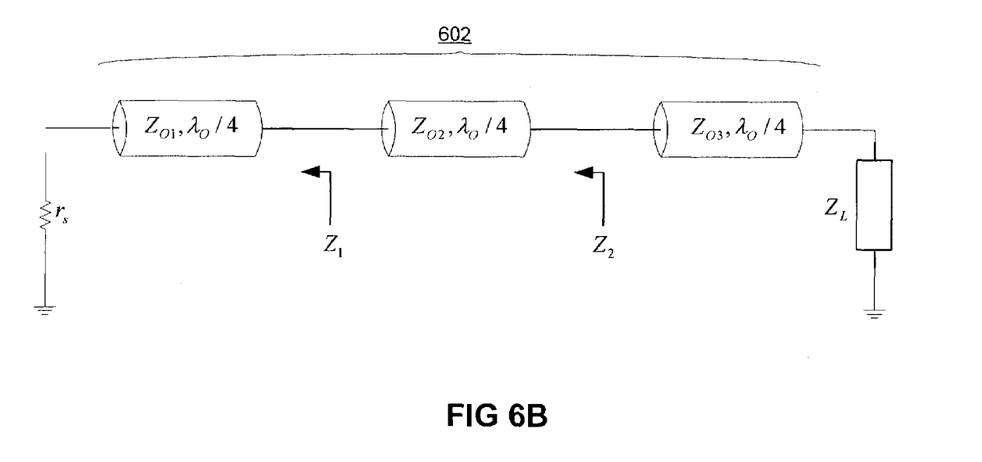

FIGS. 6A and 6B illustrate the impedance matching with a single line 601 and a cascade of three quarter-wavelength transmission lines 602 respectively. Assuming that $r_s$ is smaller than $Z_L$, for a gradual impedance matching in the cascade of three lines 602 maintaining small reflection coefficients and wideband impedance matching, the transformed impedances $Z_1$ and $Z_2$, must satisfy:

$$r_s < Z_1 < Z_2 < Z_L$$

As a result, the characteristic impedances of the cascaded lines 602 must satisfy the condition:

$$Z_{O1} < Z_{O2} < Z_{O3}$$

Since the impedance matching for the two approaches shown in FIGS. 6A and 6B achieve the same overall $r_s$ to $Z_L$ transformation ratio, then $Z_O$ can be expressed as:

$$Z_O = \frac{Z_{O1} Z_{O3}}{Z_{O2}}$$

The switching power transistor 401 output capacitance can be included in the generation of the LC ladder equivalent of the quarter-wavelength transmission line 303. Moreover, including the input and output capacitances of the phase shifter driving transistors into the phase shifter LC ladders is possible and further simplifies the design of the PS transmitter.

What is claimed is:

1. A method of improving the signal linearity, power efficiency, and frequency bandwidth of a communication system transmitter, comprising the steps of:

(a) utilizing a baseband operation to generate at least first and second voltages which are in conformity with an input transmission signal;

(b) using said first and second voltages in phase shifters to generate respective first and second component signals having substantially constant envelopes and varying phases;

(c) amplifying said first and second component signals separately using power efficient methods; and (d) combining said first and second component signals following amplification using wideband methods to produce an output signal in proportion to the input transmission signal;

wherein using phase shifters to generate the first and second component signals comprises:

(i) using at least one LC network, consisting of at least one inductor and one capacitor, implementing a quarter-wavelength transmission line;

(ii) cascading an even number of said quarter-wavelength transmission lines to implement the delay lines of a phase shifter; and (iii) replacing capacitors of the delay lines with varactors whose capacitance change by applying the said first and second voltages.

2. A system for improving the linearity and efficiency of a communication system transmitter, comprising:

(a) means to generate at least first and second voltages which are in conformity with an input transmission signal;

(b) means to utilize said first and second voltages at phase shifters to generate respective first and second component signals having substantially constant envelopes and varying phases;

(c) means to amplify said first and second component signals separately using individual non-linear amplifiers;

(d) means to absorb large parasitic output capacitors of each amplifying transistor into a corresponding matching network and hence increase the power efficiency of the non-linear amplifiers; and (e) means to combine said first and second component signals following amplification to produce an output signal in proportion to the input transmission signal;

wherein each matching network of step (d) is implemented by using 2K+1 cascades of quarter wavelength transmission lines, where K is an integer $\geq 1$, with characteristic impedances varying from low impedances seen at the output of the power amplifier towards high impedances seen at the antenna.

* * * * *